(12) United States Patent
Rand et al.

(10) Patent No.: US 12,180,400 B2
(45) Date of Patent: Dec. 31, 2024

(54) SURFACE ENGINEERED ORGANIC-INORGANIC HYBRID PEROVSKITE NANOCRYSTALS AND APPLICATIONS THEREOF

(71) Applicant: The Trustees of Princeton University, Princeton, NJ (US)

(72) Inventors: Barry P. Rand, Princeton, NJ (US); Zhengguo Xiao, Plainsboro, NJ (US)

(73) Assignee: The Trustees of Princeton University, Princeton, NJ (US)

( * ) Notice: Subject to any disclaimer, the term of this patent is extended or adjusted under 35 U.S.C. 154(b) by 562 days.

(21) Appl. No.: 17/413,271

(22) PCT Filed: Oct. 11, 2019

(86) PCT No.: PCT/US2019/055836
§ 371 (c)(1),
(2) Date: Jun. 11, 2021

(87) PCT Pub. No.: WO2020/123022
PCT Pub. Date: Jun. 18, 2020

(65) Prior Publication Data
US 2022/0306936 A1    Sep. 29, 2022

Related U.S. Application Data

(60) Provisional application No. 62/778,611, filed on Dec. 12, 2018.

(51) Int. Cl.
C09K 11/06    (2006.01)
H01G 9/20    (2006.01)
(Continued)

(52) U.S. Cl.
CPC .......... C09K 11/06 (2013.01); H01G 9/2009 (2013.01); H10K 30/10 (2023.02); H10K 85/30 (2023.02);
(Continued)

(58) Field of Classification Search
None
See application file for complete search history.

(56) References Cited

U.S. PATENT DOCUMENTS

2017/0053746 A1*  2/2017  Belcher .................. H10K 30/20
2017/0233645 A1*  8/2017  Zhong .................... C09K 11/66
                                                         252/301.16
2020/0090876 A1*  3/2020  Zhu ........................ H01G 9/008

FOREIGN PATENT DOCUMENTS

WO    20120112821 A1    8/2012
WO    2017184292 A1    10/2017

OTHER PUBLICATIONS

Y. Zhou et al., "Benzylamine-treated wide-bandgap perovskite with high thermal-photostability and photovoltaic performance", Advanced Energy Materials 7, 1701048 (Year: 2017).*
(Continued)

Primary Examiner — Ryan S Cannon
(74) Attorney, Agent, or Firm — J. Clinton Wimbish; Maynard Nexsen PC

(57) ABSTRACT

In one aspect, organic-inorganic nanoparticle compositions are described herein comprising engineered surfaces which, in some embodiments, reduce non-radiative recombination mechanisms, thereby providing optoelectronic devices with enhanced efficiencies. In some embodiments, a nanoparticle composition comprises a layer of organic-inorganic perovskite nanocrystals, the organic-inorganic perovskite nanocrystals comprising surfaces associated with growth passivation ligands and trap passivation ligands, wherein the growth passivation ligands are larger than the trap passivation
(Continued)

ligands and are of size unable to incorporate into octahedral corner sites of the perovskite crystal structure.

32 Claims, 9 Drawing Sheets

(51) Int. Cl.
  *H10K 30/10* (2023.01)
  *H10K 85/30* (2023.01)
  *B82Y 20/00* (2011.01)
  *B82Y 40/00* (2011.01)

(52) U.S. Cl.
  CPC .............. *B82Y 20/00* (2013.01); *B82Y 40/00* (2013.01); *C09K 2211/10* (2013.01)

(56) References Cited

OTHER PUBLICATIONS

J. Byun et al., "Efficient visible quasi-2D perovskite light-emitting diodes", Advanced Materials 28, p. 7515-7520 (Year: 2016).*
J. Byun et al., "Supporting Information for 'Efficient visible quasi-2D perovskite light-emitting diodes'" (Year: 2016).*
V. K. Ravi, et al., "Origin of the substitution mechanism for the binding of organic ligands on the surface of CsPbBr3 perovskite nanocubes", The Journal of Physical Chemistry Letters 8, p. 4988-4994 (Year: 2017).*
G. H. Ahmed, et al., "Pyridine-induced dimensionality change in hybrid perovskite nanocrystals", Chemistry of Materials 29, p. 4393-4400 (Year: 2017).*
J. Cho et al., "Ligand-mediated modulation of layer thicknesses of perovskite methylammonium lead bromide nanoplatelets", Chemistry of Materials 28, p. 6909-6916 (Year: 2016).*
S. A. Veldhuis et al., "Benzyl alcohol-treated CH3NH3PbBr3 nanocrystals exhibiting high luminescence, stability, and ultralow amplified spontaneous emission thresholds", Nano Letters 17, p. 7424-7432 (Year: 2017).*
International Search Report and Written Opinion corresponding to PCT/US2019/055836, mailed Jan. 6, 2020, 11 pages.
Ma, HH, et al., Growth of Metal Halide Perovskite, from Nanocrystal to Micron-Scale Crystal: A Review. Crystals. Apr. 24, 2018, vol. 8, No. 182. DOI: 10.3390/cryst8050182; Abstract; p. 9 of 25, First Paragraph.
Xiao, Z, et al., Thin-Film Semiconductor Perspective of Organometal Trihalde Perovskite Materials for High Efficiency Solar Cells, Department of Mechanical and Materials Engineering and Nebraska Center for Materials and Nanoscience, University of Nebraska-Lincoln. 2016; p. 8, First Paragraph.
Xiao, Z, et al., Efficient Perovskite Light-Emitting Diodes Featuring Nanometre-Sized Crystallites, Nature Photonics, Jan. 16, 2017, vol. 11. DOI: 10.1038/NPHOTON .2016.269; p. 114, Hysteresis and Stability of Hybrid Perovskite LEDs Section, First Paragraph.

* cited by examiner

SURFACE ENGINEERED ORGANIC-INORGANIC HYBRID PEROVSKITE NANOCRYSTALS AND APPLICATIONS THEREOF

RELATED APPLICATION DATA

This application is a U.S. National Phase of PCT/US2019/055836, filed Oct. 11, 2019, which claims priority to U.S. Provisional Patent Application Ser. No. 62/778,611 filed Dec. 12, 2018, each of which is incorporated herein by reference in its entirety.

STATEMENT OF GOVERNMENT RIGHTS

The invention was made with government support under Grant No. FA9550-18-1-0037 awarded by the United States Air Force Office of Scientific Research. The government has certain rights in the invention.

BACKGROUND

Hybrid organic-inorganic metal halide perovskites are being considered for various types of electronic and optoelectronic devices, such as solar cells, light emitting devices, photodetectors, memories, and other electronic devices. Perovskite light emitting diodes (PeLEDs) are particularly interesting due to certain advantages over both organic LEDs (OLEDs) and quantum dot LEDs (QLEDs). For example, full width at half maximum (FWHM) of PeLEDs reaches 20 nm at an emission wavelength around 520 nm, smaller than that of either OLEDs (>40 nm) or QLEDs (~30 nm). Therefore, the emission color is more pure. The emission wavelength of PeLEDs can be tuned by component engineering such as by alloying the halide component. In addition, the carrier mobility of hybrid perovskites can exceed 100 $cm^2/Vs$, an order of magnitude higher than organic semiconductors and quantum dots (QDs). Therefore, the current density through PeLEDs and thus the highest brightness has the potential to be greater than that of OLEDs and QLEDs. However, PeLEDs can suffer from various non-radiative recombination mechanisms, substantially degrading external quantum efficiencies (EQEs).

SUMMARY

In one aspect, organic-inorganic nanoparticle compositions are described herein comprising engineered surfaces which, in some embodiments, reduce non-radiative recombination mechanisms, thereby providing optoelectronic devices with enhanced efficiencies. In some embodiments, a nanoparticle composition comprises a layer of organic-inorganic perovskite nanocrystals, the organic-inorganic perovskite nanocrystals comprising surfaces associated with growth passivation ligands and trap passivation ligands, wherein the growth passivation ligands are larger than the trap passivation ligands and are of size unable to incorporate into octahedral corner sites of the perovskite crystal structure. The trap passivation ligands, in some embodiments, fill uncoordinated and/or undercoordinated surface sites on metal and/or halide elements of the organic-inorganic perovskite nanocrystals.

In another aspect, optoelectronic devices are described herein. An optoelectronic device, in some embodiments, comprises a photoactive layer including organic-inorganic perovskite nanocrystals, the organic-inorganic perovskite nanocrystals comprising surfaces associated with growth passivation ligands and trap passivation ligands, wherein the growth passivation ligands are larger than the trap passivation ligands and are of size unable to incorporate into octahedral corner sites of the perovskite crystal structure.

In a further aspect, methods of making nanoparticle compositions are described herein. In some embodiments, a method comprises providing a mixture including metal halide, growth passivation ligand, and trap passivation ligand in a solvent, the trap passivation ligand being present in stoichiometric excess relative to the metal halide. The mixture is deposited on a substrate to form a layer comprising organic-inorganic perovskite nanocrystals, the organic-inorganic perovskite nanocrystals comprising surfaces associated with growth passivation ligands and trap passivation ligands, wherein the growth passivation ligands are larger than the trap passivation ligands and are of size unable to incorporate into octahedral corner sites of the perovskite crystal structure. In some embodiments, the method further comprises filling uncoordinated and/or undercoordinated surface sites on metal and/or halide elements of the organic-inorganic perovskite nanocrystals with the trap passivation ligands.

These and other embodiments are further described in the following detailed description.

DETAILED DESCRIPTION

Figure 1:
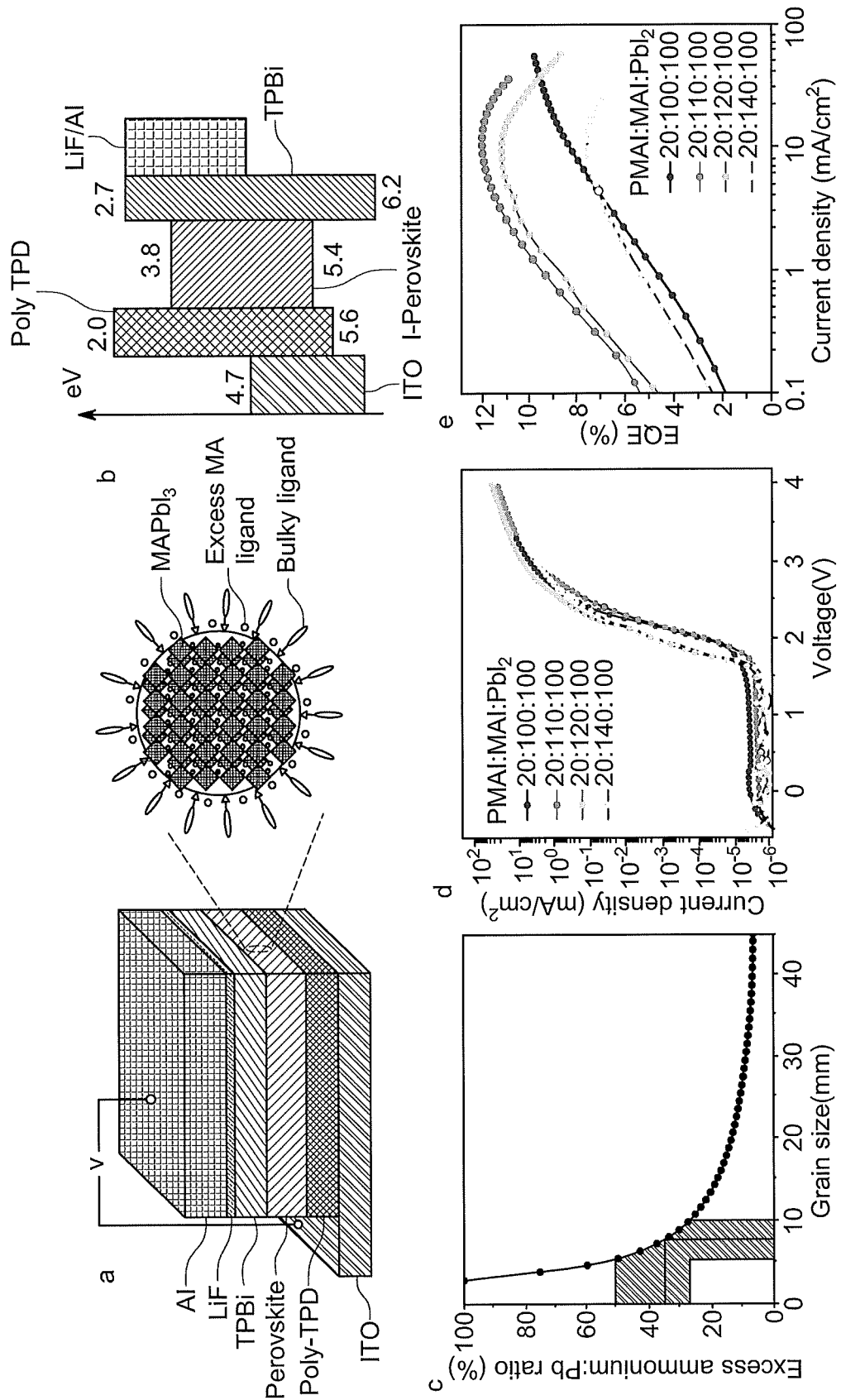
FIG. 1a is a schematic of a light emitting diode comprising an organic-inorganic perovskite nanocrystalline layer according to some embodiments.
FIG. 1b illustrates an energy level diagram of a PeLED according to some embodiments.
FIG. 1c details excess passivation ligand (e.g. ammonium halide) required for providing perovskite surfaces terminated with passivation ligand, with the shaded bands representing the range of perovskite particle sizes in the film.
FIG. 1d are current density-voltage plots for PeLEDs of various construction described herein.
FIG. 1e are EQE-current density plots for PeLEDs of various construction described herein.

Embodiments described herein can be understood more readily by reference to the following detailed description and examples and their previous and following descriptions. Elements, apparatus and methods described herein, however, are not limited to the specific embodiments presented in the detailed description and examples. It should be recognized that these embodiments are merely illustrative of the principles of the present invention. Numerous modifications and adaptations will be readily apparent to those of skill in the art without departing from the spirit and scope of the invention.

Definitions

The term "alkyl" as used herein, alone or in combination, refers to a straight or branched saturated hydrocarbon group. For example, an alkyl can be $C_1$-$C_{30}$.

The term "alkenyl" as used herein, alone or in combination, refers to a straight or branched chain hydrocarbon group having at least one carbon-carbon double bond.

The term "aryl" as used herein, alone or in combination, refers to an aromatic monocyclic or multicyclic ring system optionally substituted with one or more ring substituents The term "heteroaryl" as used herein, alone or in combination, refers to an aromatic monocyclic or multicyclic ring system in which one or more of the ring atoms is an element other than carbon, such as nitrogen, oxygen and/or sulfur.

The term "cycloalkyl" as used herein, alone or in combination, refers to a non-aromatic, saturated mono- or multicyclic ring system optionally substituted with one or more ring substituents.

The term "cycloalkenyl" as used herein, alone or in combination, refers to a non-aromatic, mono- or multicyclic ring system having at least one carbon-carbon double bond and is optionally substituted with one or more ring substituents.

The term "heteroalkyl" as used herein, alone or in combination, refers to an alkyl moiety as defined above, having one or more carbon atoms, for example one, two or three carbon atoms, replaced with one or more heteroatoms, which may be the same or different.

I. Nanoparticle Compositions

In one aspect, organic-inorganic nanoparticle compositions are described herein comprising engineered surfaces. In some embodiments, a nanoparticle composition comprises a layer of organic-inorganic perovskite nanocrystals, the organic-inorganic perovskite nanocrystals comprising surfaces associated with growth passivation ligands and trap passivation ligands, wherein the growth passivation ligands are larger than the trap passivation ligands and are of size unable to incorporate into octahedral corner sites of the perovskite crystal structure. The trap passivation ligands, in some embodiments, fill uncoordinated surface sites on metal and/or halide elements of the organic-inorganic perovskite nanocrystals.

In some embodiments, organic-inorganic perovskite nanocrystals are of the formula $Me_{1-y}A_yBX_{3-z}Y_z$, wherein Me is an alkali metal cation, A is an organic cation, B is an element selected from the group consisting of transition metals, Group IVA elements and rare earth elements and X and Y are independently selected from Group VIIA elements, wherein $0<y\leq1$ and wherein $0\leq z<3$. Accordingly, organic-inorganic perovskite nanocrystals can be single-halide or mixed-halide compositions. Organic cation A can be any organic cation compatible with interstitial spaces of the perovskite structure. In some embodiments, organic cation A is an ammonium, alkyl-ammonium, guanidinium, azetidinium, azetamidinium, imidazolium, pyrrolidinium, or formamidinium ion. Alkyl-ammonium ion can include $CH_3NH_3^+$ and/or $CH_3CH_2NH_3^+$, in some embodiments. Moreover, B can be any metal cation compatible with corner sharing $BX_6$ octahedra of the perovskite crystalline structure. In several embodiments described herein, B is lead (Pb) cation, but can be other transition metals or rare earth elements. In some embodiments, B can comprise two or more transition metals as described below. Additionally, in some embodiments, X and Y are independently selected from Cl, I and Br.

Organic-inorganic perovskite nanocrystals of mixed halide systems can also be of the formula $AB_{1-p}M_pX_{3-z}Y_z$, wherein A is an organic cation, B and M are elements independently selected from the group consisting of transition metals, Group IVA elements and rare earth elements and X and Y are independently selected from Group VIIA elements, wherein $0\leq p<1$ and wherein $0\leq z<3$. Specific examples of A, B, X and Y are provided above. In some embodiments, B and M are lead and tin, respectively.

As described herein, growth ligands are associated with surfaces of the organic-inorganic perovskite nanocrystals. In some embodiments, growth passivation ligands are operable to self-assemble at the 3D-perovskite grain surface and impede grain growth of 3D perovskite grains. Such action can permit the formation of organic-inorganic nanocrystals having an average size less than 20 nm, such as 1-10 nm. Moreover, presence of the growth passivation ligands can permit formation of ultra-smooth films having root mean square (RMS) surface roughness of less than 10 nm, less than 2 nm or less than 1 nm. Suitable ligands are sufficiently large to prevent or block incorporation of the ligands into octahedral corner sites of the inorganic crystal structure. Any ligand meeting the foregoing size requirement and operable to associate with organic-inorganic perovskite nanocrystal surfaces can be employed. In some embodiments, suitable growth passivation ligands comprise one or more species of organoammonium ions. Organoammonium ions can comprise one or more substituents selected from the group consisting of alkyl, heteroalkyl, alkenyl, cycloalkyl, cycloalkenyl, heterocycloalkyl, aryl and heteroaryl. For alkyl, heteroalkyl and/or alkenyl ammonium ions, the carbon chain may be sufficiently long and/or branched to meet the octahedral corner size exclusion requirement. Similarly, cycloalkyl, cycloalkenyl, heterocycloalkyl, aryl and/or heteroaryl ammonium ions can present sufficiently large ring structure and/or associated ring substituents to meet the octahedral corner size exclusion requirement. In some embodiments, growth passivation ligands associated with surfaces of the organic-inorganic perovskite nanocrystals comprise n-butylammonium (BA), 4-fluorophenylmethylammonium (FPMA), 4,5-flurorophenylammonium, phenylammonium (aka anilium) and/or phenylalkylammonium, such as phenylethylammonium or phenylmethylammonium (aka benzylammonium).

Moreover, in some embodiments, growth passivation ligands associated with surfaces of the organic-inorganic perovskite nanocrystals form a matrix in which the organic-inorganic perovskite nanocrystals are positioned or embedded. In some embodiments, the matrix is continuous wherein the organic-inorganic perovskite nanocrystals are dispersed throughout the matrix. Matrices formed by ligands can contribute to desirable properties of organic-inorganic perovskite nanocrystal layers. The ligand matrix, for example, can contribute to formation of pinhole free layers and inhibit nanocrystal aggregation.

In addition to growth passivation ligands, trap passivation ligands are associated with surfaces of the organic-inorganic perovskite nanocrystals. As described herein, the trap passivation ligands can fill uncoordinated or undercoordinated surface sites of the organic-inorganic perovskite nanocrystals. Due to their large size, the growth passivation ligands can lack dense packing characteristics leaving uncoordinated and/or undercoordinated metal and halide sites at surfaces of the organic-inorganic perovskite nanocrystals. Such uncoordinated and/or undercoordinated sites can serve as charge carrier traps, leading to non-radiative recombination pathways and lower efficiencies for optoelectronic devices employing the organic-inorganic perovskite nanocrystals in photoactive layers. In being smaller than the growth passivation ligands, the trap passivation ligands can fill these uncoordinated and/or undercoordinated surface sites, thereby reducing trap densities and enhancing device efficiencies. As described herein, uncoordinated and/or undercoordinated surface sites can be on the metal (B) and/or halide (X,Y) of the organic-inorganic perovskite nanocrystals. Any ligand having the size and reactivity requirements for passivation of surface trap states can be employed. In some embodiments, for example, trap passivation ligands comprise organoammonium ions including, but not limited to, organoammonium ions comprising one or more substituents selected from the group consisting of alkyl and heteroalkyl. In some embodiments, for example, trap passivation ligands comprise methylammonium, ethylammonium, diethylammonium or mixtures thereof. Alternatively, trap passivation ligands can be selected from the group consisting of formamidinium, hydrazinium, guanidinium, azetidinium, azetamidinium, imidazolium, pyrrolidinium, cesium, rubidium, potassium, and mixtures thereof.

In some embodiments, organic-inorganic perovskite nanocrystals described herein have an average of less than 10 percent uncoordinated surface sites. In some embodiments, the average number of uncoordinated surface sites of the organic-inorganic perovskite nanocrystals is less than 5 percent or less than 1 percent.

Organic-inorganic perovskite nanocrystals described herein generally have an average size less than 50 nm. In some embodiments, organic-inorganic perovskite nanocrystals can have an average size less than 20 nm or less than 15 nm. Organic-inorganic perovskite nanocrystals can also have an average size selected from Table I.

TABLE I

| Average Size of Organic-inorganic Perovskite Nanocrystals |
| --- |
| ≤10 nm |
| ≤8 nm |
| 1-20 nm |
| 3-15 nm |
| 3-8 nm |
| 1-5 nm |
| 5-15 nm |

A layer formed of organic-inorganic perovskite nanocrystals described herein, in some embodiments, has root mean square (RMS) surface roughness of less than 10 nm, less than 2 nm or less than 1 nm. For example, a layer formed of organic-inorganic perovskite nanocrystals can have surface roughness (RMS) of 0.3-2 nm or 0.5-1 nm. The extremely smooth surfaces can enhance performance efficiencies of electronic devices incorporating the layers. In some embodiments, for example, the low surface roughness can permit thinner hole and/or electron transport layers and reduce contact resistance.

A layer formed of organic-inorganic perovskite nanocrystals can also exhibit peak light emission across the visible region and into the near infrared region of the electromagnetic spectrum. As detailed in the examples herein, peak emission wavelength from layers of organic-inorganic perovskite nanocrystals can be dependent on several considerations including specific composition and size of the perovskite nanocrystals. Accordingly, organic-inorganic perovskite nanocrystals described herein can be tuned for emission at various wavelengths in the visible and/or infrared regions. Tunable emission in the visible and infrared regions enables application of organic-inorganic perovskite nanocrystals in LED apparatus. Moreover, the organic-inorganic perovskite nanocrystals can have absorption profiles falling within the visible and/or ultraviolet regions. Such absorption properties can enable employment of the organic-inorganic perovskite nanocrystals in photovoltaic apparatus.

A layer formed of organic-inorganic perovskite nanocrystals can have any desired thickness consistent with objectives of the present invention. An organic-inorganic perovskite nanocrystal layer can generally have thickness of 10-200 nm or 20-100 nm. In some embodiments, an organic-inorganic perovskite nanocrystal layer has thickness less than 10 nm or greater than 200 nm. Layer thickness can be dependent upon several considerations including, but not limited to, carrier mobilities in the layer as well as function of the layer. Organic-organic rovskite nanocrystal layers employed in photovoltaic applications may have different thicknesses than those employed in LED applications.

In some embodiments, a layer comprising organic-inorganic perovskite nanocrystals can exhibit a quantum yield of at least 16% or at least 18%. Moreover, a layer comprising organic-inorganic perovskite nanocrystals can also exhibit a radiative recombination rate of at least $4.0 \times 10^6$ s$^{-1}$, in some embodiments.

II. Optoelectronic Devices

In another aspect, optoelectronic devices are described herein. An optoelectronic device, in some embodiments, comprises a photoactive layer including organic-inorganic perovskite nanocrystals, the organic-inorganic perovskite nanocrystals comprising surfaces associated with growth passivation ligands and trap passivation ligands, wherein the growth passivation ligands are larger than the trap passivation ligands and are of size unable to incorporate into octahedral corner sites of the perovskite crystal structure. The organic-inorganic perovskite nanocrystals of the photoactive layer can have any composition, properties and/or structure described in Section I herein. In some embodiments, one or more layers of organic-inorganic perovskite nanocrystals serve as the photoactive layer. In such embodiments, the layer of organic-inorganic perovskite nanocrystals can have any composition, properties and/or structure described in Section I herein.

In some embodiments, the optoelectronic device comprising a photoactive layer including the organic-inorganic perovskite nanocrystals is a light emitting diode (LED). An LED incorporating one or more organic-inorganic perovskite nanocrystal layers described herein can have the general construction comprising a first electrode and second electrode. One or both of the first and second electrodes can be radiation transmissive. In some embodiments, for example, the first and/or second electrode can be formed of a radiation transmissive conducting oxide. Radiation transmissive conducting oxides can include one or more of indium tin oxide (ITO), gallium indium tin oxide (GITO), aluminum tin oxide (ATO), aluminum doped zinc oxide (AZO), fluorinated tin oxide (FTO), and zinc indium tin oxide (ZITO). In some embodiments, a radiation transmissive first and/or second electrode is formed of a polymeric material such as polyaniline (PANT) and its chemical relatives or 3,4-polyethylenedioxythiophene (PEDOT). Further, a radiation transmissive first and/or second electrode can be formed of a carbon nanotube or metal nanowire layer having a thickness/density operable to at least partially pass visible electromagnetic radiation. Additionally, a layer of lithium fluoride (LiF) or lithium oxide (Li$_2$O) can be positioned between the first and/or second electrode and another layer of the device. For example, a layer of LiF or Li$_2$O can be positioned between an electron dopant layer and electrode.

One or more one or more organic-inorganic perovskite nanocrystal layers described herein are positioned between the first and second electrodes. In some embodiments, one or more hole transport layers (HTL) are positioned between the anode and organic-inorganic perovskite nanocrystal layer(s). Similarly, one or more electron transport layers (ETL) can be positioned between the cathode and organic-inorganic perovskite nanocrystal layer(s). Specific compositional identity of HTLs and ETLs can be dependent upon the electronic structure of the organic-inorganic perovskite nanocrystal layer(s) and electrode composition. In some embodiments, for example, a HTL comprises poly[N,N'-bis(4-butylphenyl)-N,N'-bis(phenyl)-benzidine] (poly-TPD), poly(9-vinylcatbazole) (PVK), 3,3'-di(9H-carbazol-9-yl)-1,1'-biphenyl (CBP), or PEDOT:PSS. In some embodiments, an ETL comprises 2,2',2''-(1,3,5-benzinetriyl)-tris(1-phenyl-1-H-benzimidazole) (TPBi) or phenyl-dipyrenylphosphine oxide (POPy$_2$).

In some embodiments, a LED comprising a photoactive layer of organic-inorganic perovskite nanocrystals has an external quantum efficiency (EQE) of at least 10 percent or at least 15 percent. EQE of an LED having architecture described herein can be 16-25 percent, in some embodiments.

III. Methods of Making Organic-Inorganic Perovskite Nanocrystals

In a further aspect, methods of making nanoparticle compositions are described herein. In some embodiments, a method comprises providing a mixture including metal halide, growth passivation ligand, and trap passivation ligand in a solvent, the trap passivation ligand being present in stoichiometric excess relative to the metal halide for organic-inorganic perovskite nanoparticle formation. The mixture is deposited on a substrate to form a layer comprising organic-inorganic perovskite nanocrystals, the organic-inorganic perovskite nanocrystals comprising surfaces associated with growth passivation ligands and trap passivation ligands, wherein the growth passivation ligands are larger than the trap passivation ligands and are of size unable to incorporate into octahedral corner sites of the perovskite crystal structure. In some embodiments, a method further comprises filling uncoordinated surface sites on metal and/or halide elements of the organic-inorganic perovskite nanocrystals with the trap passivation ligands.

Turning now to specific steps, a mixture is provided comprising metal halide, growth passivation ligand, and trap passivation ligand in a solvent. The trap passivation ligand is present in the mixture in a stoichiometric excess relative to the metal halide. In some embodiments, trap passivation ligand is present in a stoichiometric excess of at least 10 percent. Stoichiometric excess of trap passivation ligand can also be selected from Table II.

TABLE II

| Stoichiometric Excess of Trap Passivation Ligand (%) |
| --- |
| ≥15 |
| 10-40 |
| 10-30 |
| 10-20 |
| 15-30 |
| 15-25 |

As described further herein, stoichiometric amounts of trap passivation ligand can combine with metal halide (e.g. BX$_2$ wherein B and X are defined herein) to form organic-inorganic perovskite nanocrystals having the formula Me$_{1-y}$A$_y$BX$_{3-z}$Y$_z$ or AB$_{1-p}$M$_p$X$_{3-z}$Y$_z$. Trap passivation ligand in excess of the stoichiometric amount required for nanocrystal formation can fill uncoordinated and/or undercoordinated surface sites of the perovskite nanocrystals. Moreover, the growth passivation ligands maintains the function of limiting perovskite nanocrystal growth, thereby providing organic-inorganic nanocrystals generally having an average size less than 20 nm. Table III provides various moalr ratios of growth passivation ligand, trap passivation ligand, and metal halide in the mixture, according to some embodiments.

TABLE III

Growth Passivation Ligand:Trap Passivation
Ligand:Metal Halide Molar Ratio

20:110:100
20:120:100
20:130:100
20:140:100

Growth passivation ligand, trap passivation ligand, and metal halide can have any compositional identity described herein. In some embodiments, for example, growth passivation ligand comprises organoammonium ions comprising one or more substituents selected from the group consisting of alkyl, heteroalkyl, alkenyl, cycloalkyl, cycloalkenyl, heterocycloalkyl, aryl and heteroaryl. For alkyl, heteroralkyl and/or alkenyl ammonium ions, the carbon chain may be sufficiently long and/or branched to satisfy the octahedral corner size exclusion requirement. Similarly, cycloalkyl, cycloalkenyl, heterocycloalkyl, aryl and/or heteroaryl ammonium ions can present sufficiently large ring structure and/or associated ring substituents to meet the octahedral corner size exclusion requirement. In some embodiments, additives comprise n-butylammonium (BA), 4-fluorophenylmethylammonium (FPMA), 4,5-fluorophenylammonium, phenylammonium, phenylammonium and/or phenylalkylammonium, such as phenylethylammonium or phenylmethylammonium cations. Trap passivation ligands can comprise organoammonium ions including one or more substituents selected from the group consisting of alkyl and heteroalkyl. In some embodiments, for example, trap passivation ligands comprise methylammonium, ethylammonium, diethylammonium or mixtures thereof. Alternatively, trap passivation ligands can be selected from the group consisting of formamidinium, hydrazinium, guanidinium, azetidinium, azetamidinium, imidazolium, pyrrolidinium, cesium, rubidium, potassium, and mixtures thereof.

Suitable solvent for the mixture can generally comprise one or more polar aprotic solvents including, but not limited to, N,N-dimethylformamide (DMF), dimethylsulfoxide (DMSO), acetonitrile (MeCN), gamma-butyrolactone, and acetone. In some embodiments of mixed halide systems, more than one solvent is employed depending on solubility requirements of the individual organic-inorganic precursors in the mixture.

The mixture is deposited on a substrate to form a layer comprising organic-inorganic perovskite nanocrystals, the organic-inorganic perovskite nanocrystals comprising surfaces associated with growth passivation ligands and trap passivation ligands, wherein the growth passivation ligands are larger than the trap passivation ligands and are of size unable to incorporate into octahedral corner sites of the perovskite crystal structure. The mixture can be deposited by one of several techniques including spin coating, spray coating, drop casting, doctor blading, or thermal evaporation. In some embodiments, the substrate comprises a component of an LED, such as an electrode, HTL or ETL. Organic-inorganic perovskite nanocrystals and associated nanocrystal layers can have any structure, composition, and/or properties described Section I herein.

These and other embodiments are further illustrated in the following non-limiting examples.

Example 1—Organic-Inorganic Perovskite Films and Light Emitting Diodes Comprising the Same As described in this example, boost the EQE of perovskite LEDs (PeLEDs) is increased to above 15% via perovskite nanocrystal surface engineering, specifically through control of surface stoichiometry to ensure minimal undercoordinated Pb and iodide (complete $PbI_6$ with organoammonium coordinated with iodide). Excess methyl ammonium iodide (MAI) is employed to promote an organoammoniumterminated grain surface to further reduce trap density. Structure of the bulky organoammonium additive is subsequently modified to investigate potential structure-property relationships with regard to the choice of the bulky cation, monitoring changes to film structure and optoelectronic properties. By doing so, EQEs of 15.2% were achieved for $MAPbI_3$-based PeLEDs. Both time-resolved PL (TRPL) and PL quantum yield (PLQY) measurement confirmed the reduced trap-assisted non-radiative recombination and improved radiative combination following surface modification.

FIGS. 1a and 1b illustrate the device structure and energy level diagram for PeLEDs fabricated and characterized in this example. It was noted that the conduction and valence band of perovskites are mainly formed by Pb 6p and I 4p orbitals (Br 4p orbital for Br-perovskite). Accordingly, surface traps originate primarily from lead and halide dangling bonds and/or vacancies. Therefore, perovskite nanocrystals with complete PbI6 octahedral, also noted as organoammonium terminated surfaces, were engineered to reduced trap density. It was found that an excess of ammonium halide (trap passivation ligand) was required to eliminate Pb/I dangling bonds. As illustrated in FIG. 1C, a straightforward calculation counting the number of iodide and Pb atoms within cubic nanocrystals revealed that the excess ammonium iodide can become very large as the perovskite nanocrystal diameter decreases. It showed that approximately 30-40% molar excess organoammonium halide (trap passivation ligand) is needed for perovskite nanocrystals with 5-10 nm diameter.

Bulky organoammonium ligands, with an optimized molar ratio of 20%, were able to self-assemble at the 3D-perovskite grain surface and impede the grain growth of 3D perovskite grains, resulting in the formation of ultrasmooth films with grain sizes around 5-10 nm. The excess bulky organoammonium halide served a dual role to decrease the size of the crystals and provide excess iodide to ensure complete $PbI_6$ octahedra. However, with higher amounts of bulky organoammonium halides, PeLED performance drops due to the increasing fraction of Ruddlesden-Popper (RP) phases.

FIG. 1c clearly shows that the 5-10 nm size particles induced by 20% excess bulky organoammonium halide still lack 10-20% excess iodide to ensure complete $PbI_6$ octahedron with organoammonium termination. In order to avoid the formation of RP phases in the film while simultaneously increasing the ability of organoammonium halide ligands to passivate surfaces, extra MAI is added in the precursor solution while maintaining an optimized bulky ligand excess of 20%. As shown in FIG. 1a, the extra MAI assembles at the perovskite NC surface whereas bulky organoammonium ligands are unable to pack as densely. Phenylmethylammonium iodide (PMAI), also known as benzylammonium iodide, was used as a prototypical bulky ligand in this example. As shown in FIGS. 1d-1e, all PeLEDs have extremely low leakage current, indicating uniform and compact films with the extra organoammonium ligands (trap passivation ligand). With an MAI:PbI$_2$ molar ratio of 100:100 (i.e. stoichiometric for a bulk crystal), PeLEDs exhibits an EQE of approximately 10%.

Notably, the EQE reached 12% and 11.8% when the excess MAI (trap passivation ligand) molar ratio is increased to 10% and 20% or MAI:PbI$_2$ molar ratio increased to 110:100 and 120:100, respectively. The EQE decreases with higher molar ratio. The optimized excess MAI and PMAI ratio in total is consistent to the calculated ratio of 30%-40% excess iodide to engineer surface stoichiometry given the nanocrystal dimensions.

Figure 2:
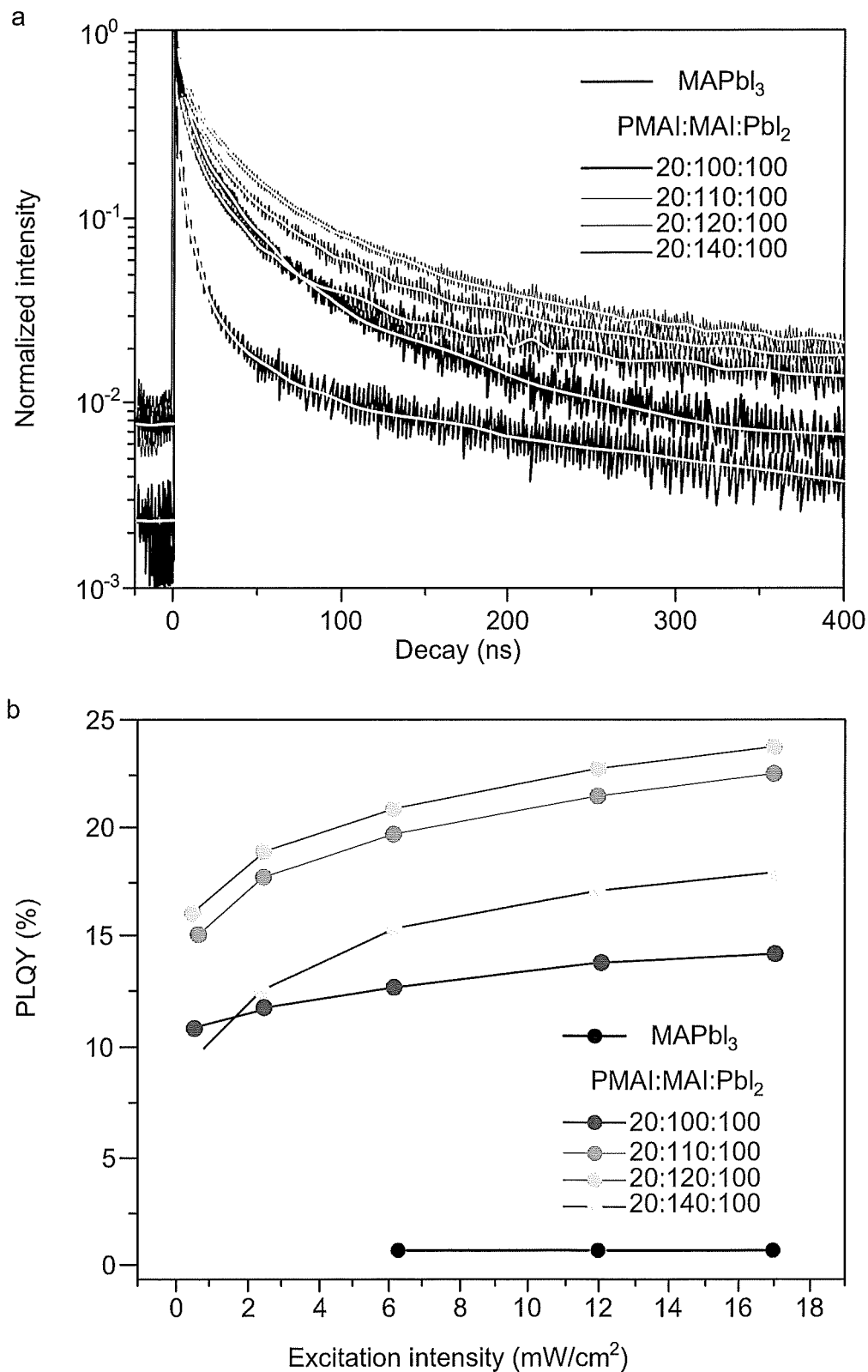
FIG. 2a illustrates TRPL decay as a function of excitation intensity for organic-inorganic perovskite nanocrystalline layers with differing methylammonium iodide (MAI):$PbI_2$ molar ratios with or without added phenylmethylammonium iodide (PMAI).
FIG. 2b illustrates photoluminescence quantum yield (PLQY) as a function of excitation intensity for organic-inorganic perovskite nanocrystalline layers with differing MAI:$PbI_2$ molar ratios with or without added PMAI.
Figure 3:
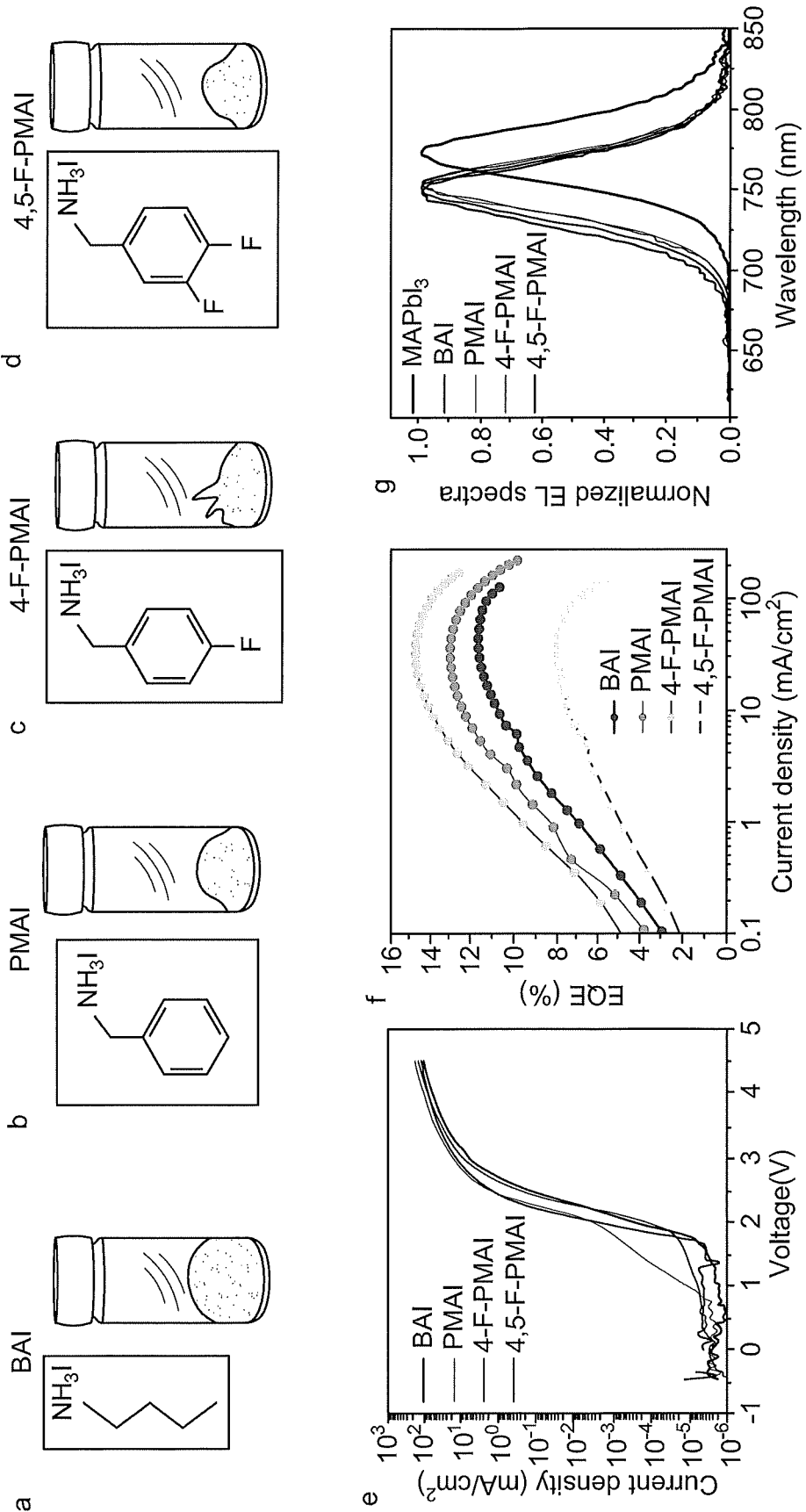
FIGS. 3a-3d detail chemical structures of various growth passivation ligands according to some embodiments.
FIG. 3e illustrates current density-voltage plots of PeLEDs with the differing growth passivation ligands of FIGS. 3a-3d with 20% excess passivation ligand (MAI).
FIG. 3f illustrates EQE-current density plots of PeLEDs with the differing growth passivation ligands of FIGS. 3a-3d with 20% excess passivation ligand (MAI).
FIG. 3g illustrates normalized electroluminescent spectra of PeLEDs with the differing growth passivation ligands of FIGS. 3a-3d with 20% excess passivation ligand (MAI).

Time resolved photoluminescence (TRPL) and photoluminescence quantum yield (PLQY) measurements were conducted to examine carrier recombination dynamics of organic-inorganic perovskite nanocrystalline films with excess MAI (trap passivation ligand). As illustrated in FIG. 2 and Table IV, compared with a control MAPbI film without any extra MAI or bulky ligands, both average carrier lifetime ($T_{average}$) and PLQY of the film with 20% PMAI are dramatically increased. The lifetime increases from 12.9 ns to 27.2 ns, and the PLQY increases from 1.7% to 10.4%, respectively. Notably, $T_{average}$ further increase to 50.1 ns and 41.0 s and PLQY further increases to 17.9% and 18.1%, with the addition of MAI (trap passivation ligand) in stoichiometric excess 10% and 20% respectively. This was explained by the passivation effect of the excess MAI ligands at the perovskite NC surfaces as illustrated in FIG. 1A.

demonstrates that, with 10-20% MAI excess, the radiative recombination is increased, while non-radiative recombination is suppressed, further confirming the passivation effect of MAI.

The effect of chemical structure of bulky organoammonium halides (growth passivation ligands) on the performance of PeLEDs was also investigated. Growth passivation ligands with an alkyl chain, specifically butylammonium, were compared with that of benzylammonium where the phenyl ring has 0, 1, and 2 fluorine substitutions. FIGS. 3a-3d provide the chemical structures of the various ammonium halides investigated. Notably, 4-F PMAI was considerably easier to recrystallize relative to the other bulky ammonium iodides. The current density-voltage (J-V) and EQE curves of PeLEDs with the different bulky ammonium iodides are provided in FIGS. 3e-3f The EQE of PeLEDs with PMAI surfactant is slightly better than the device with butylammonium iodide (BAI). Of more interest is that PeLEDs with 4-F-PMAI growth passivation ligand reach an EQE of 15.2%. This can be explained by the low trap density in the perovskite layer due to the passivation effect and suppressed ion migration of additional organoammonium halides. It should be noted that the EQE reaches greater than 4% at low current density of 0.1 mA/cm$^2$, further supporting the low leakage current and non-radiative recombination rates.

In order to determine the origin of EQE enhancement with 4-F-PMAI, scanning electron microscopy (SEM) and X-ray diffraction studies were administered to examine the influence of the chemical structure of bulky ligands (growth passivation ligands) on film morphology and crystallinity.

TABLE IV

| PMAI:MAI:PbI$_2$ | Peak emission wavelength (nm) | $T_{avg}$ (ns) | Quantum yield (%) | $k_{rad}$ (s$^{-1}$) | $k_{nonrad}$ (s$^{-1}$) |
|---|---|---|---|---|---|
| MAPbI$_3$ | 740 | 12.9 | 1.7 | $1.3 \times 10^6$ | $176 \times 10^6$ |
| 20:100:100 | 765 | 27.2 | 10.4 | $3.8 \times 10^6$ | $33 \times 10^6$ |
| 20:110:100 | 760 | 50.1 | 17.9 | $3.6 \times 10^6$ | $16 \times 10^6$ |
| 20:120:100 | 740 | 41.0 | 18.1 | $4.4 \times 10^6$ | $20 \times 10^6$ |
| 20:140:100 | 740 | 24.6 | 9.7 | $4.0 \times 10^6$ | $38 \times 10^6$ |

With stoichiometric excess of 40% of MAI, both $T_{average}$ and PLQY decrease, consistent with the performance of the PeLEDs. This may be due to the formation of low dimensional phases in the nanocrystal layer due to the presence of excessive ammonium halides.

The radiative and non-radiative recombination rates ($k_{rad}$, $k_{nonrad}$) of the organic-inorganic perovskite nanocrystalline films were also calculated. The average lifetime of the excited species, $T_{average}$, is given by $$\frac{1}{T_{average}} = k_{rad} + k_{nonrad},$$

and the PLQY is given by $$PLQY = \frac{k_{rad}}{k_{rad} + k_{nonrad}}.$$

Figure 4:
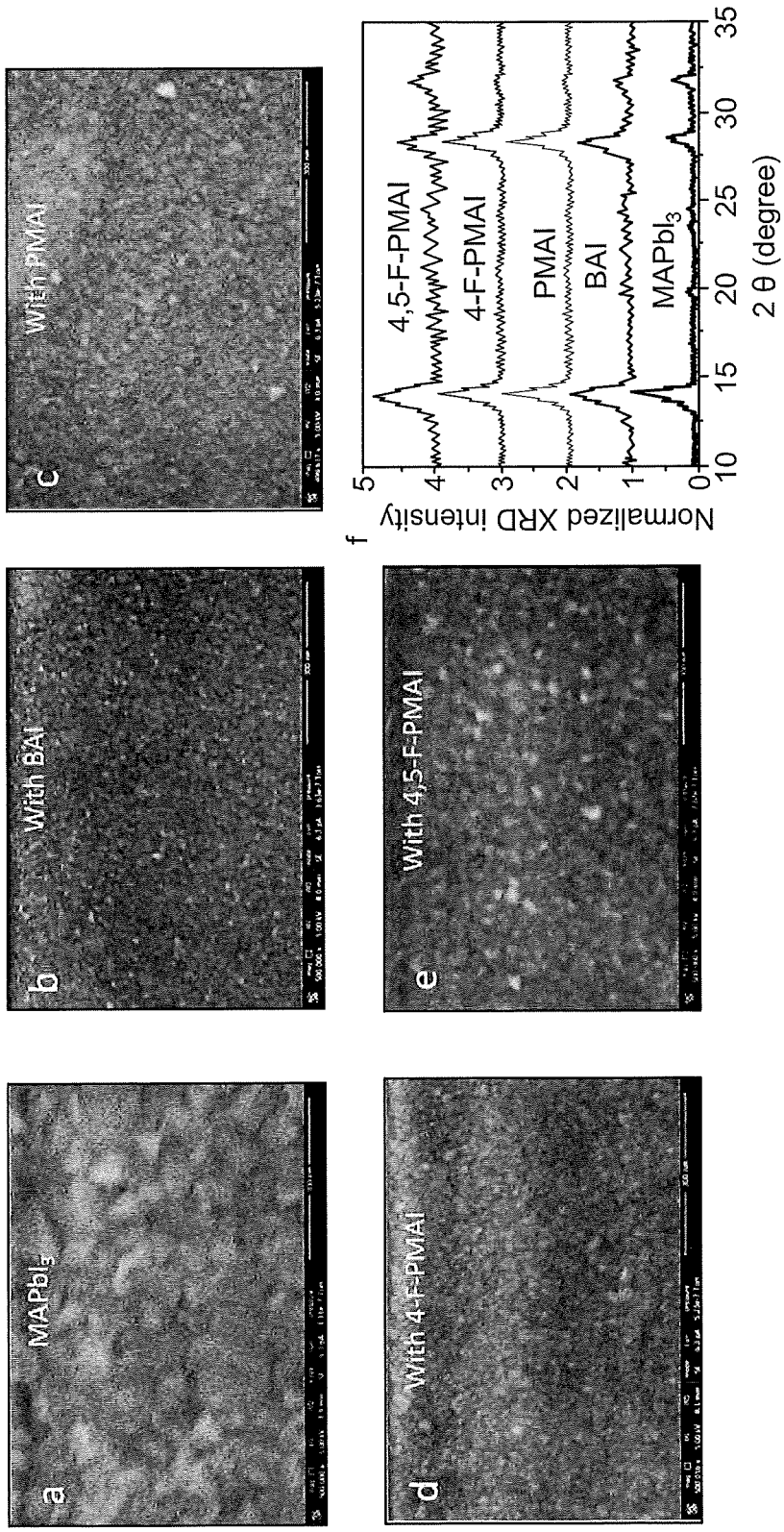
FIGS. 4a-e are scanning electron microscopy (SEM) images of organic-inorganic perovskite nanocrystalline films with the differing growth passivation ligands of FIGS. 3a-3d with 20% excess passivation ligand (MAI).
FIG. 4f provides x-ray diffractograms (XRD) of the films in FIGS. 4a-e.

Table IV summarizes the carrier lifetime, radiative and non-radiative recombination rates with different trap passivation ligand (MAI) to metal halide (PbI$_2$) ratios. It clearly FIGS. 4a-4e are SEM images of organic-inorganic perovskite nanocrystalline films comprising the various bulky ligands of the study. As illustrated in the images of FIG. 4, compared with the control MAPbI$_3$ film with average grain size of 100 nm, the films with extra methylammonium and bulky organoammonium additives have substantially smaller grains with sizes around 10 nm. This indicated that all growth passivation ligands tested in this example had a similar effect on suppressing grain growth of 3D perovskite and yielded similarly sized domains. However, the films with PMAI and 4-F-PMAI had improved crystallinity relative to films with BAI or 4,5-PMAI. This indicated that the chemical structure of the added bulky ligands had a subtle but important effect on perovskite film structure and crystallinity. The improvement may result from better tendency of 4-F-PMAI cations to pack face-on relative to other allotropes with different F position, as indicated by the centimeter sized 4-F-PMAI crystals. The better packing of phenyl rings with fluorine at the para position was also reported in two dimensional tin based perovskite films as well as flexible PeLEDs.

Figure 5:
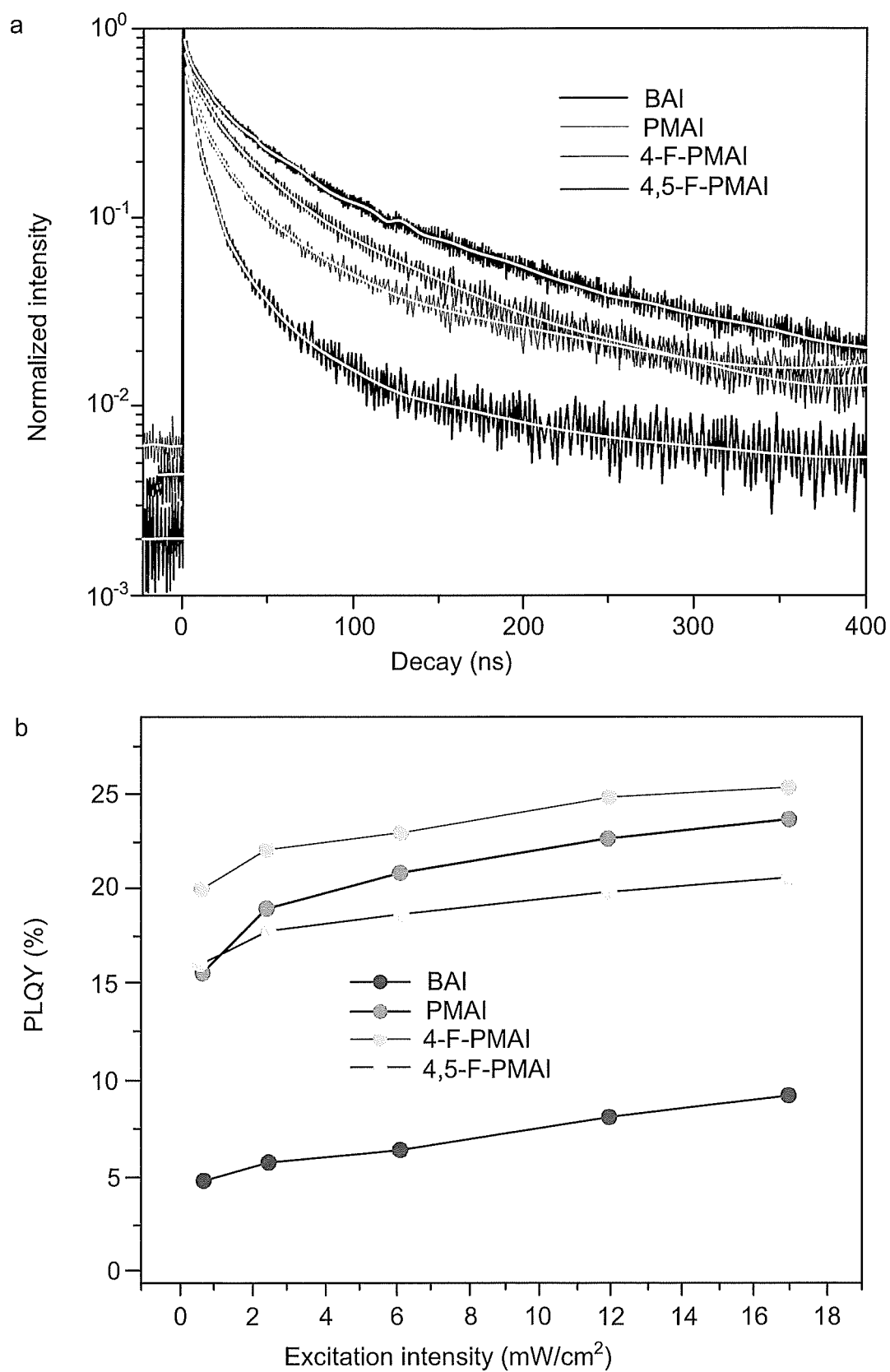
FIG. 5a provided TRPL decay of the organic-inorganic perovskite nanocrystalline films with the differing growth passivation ligands of FIGS. 3a-3d with 20% excess passivation ligand (MAI).
FIG. 5b illustrates PLQY as a function of excitation intensity of the organic-inorganic perovskite nanocrystalline films with the differing growth passivation ligands of FIGS. 3a-3d with 20% excess passivation ligand (MAI).

Furthermore, the PLQY and TRPL of films with different bulky organoammonium ligands were compared to examine their carrier recombination dynamics. As shown in FIG. 5 and Table V, the films with phenyl ring ligands exhibited longer carrier lifetime and higher PLQY than the film with the BAI ligand. Notably, the PLQY of the film with 4-FP-MAI reaches 20.1% at a low excitation intensity of 0.7 mW/cm$^2$, and is relatively constant as a function of excitation intensity increasing up to 17 mW/cm$^2$, indicating a low trap density. By combination with carrier lifetime, $k_{nonrad}$ and $k_{rad}$ of the films were calculated. As shown in Table V, the film comprising 4-F-PMAI (growth passivation ligand) and excess MAI (trap passivation ligand) displayed relatively low $k_{nonrad}$ of 23×10$^6$ s$^{-1}$ and high $k_{rad}$ of 538×10$^6$ s$^{-1}$, consistent with the performance of the PeLEDs.

TABLE V

| Bulky ligands | Peak emission wavelength | $T_{avg}$ (ns) | Quantum yield | $k_{rad}$ (s$^{-1}$) | $k_{nonrad}$ (s$^{-1}$) |
|---|---|---|---|---|---|
| BAI | 735 | 15.9 | 4.9 | 3.1 × 10$^6$ | 60 × 10$^6$ |
| PMAI | 740 | 41.0 | 18.1 | 4.4 × 10$^6$ | 20 × 10$^6$ |
| 4-F-PMAI | 740 | 34.9 | 20.1 | 5.8 × 10$^6$ | 23 × 10$^6$ |
| 4,5-F-PMAI | 745 | 35.3 | 16.1 | 4.6 × 10$^6$ | 24 × 10$^6$ |

The present example demonstrates that the NC surface plays a critical role in recombination dynamics of perovskite films and the performance of PeLEDs. Ammonium terminated NC surface are favorable as it results in fewer under-coordinated Pb surface traps, and thus low non-radiative recombination and high radiative recombination rates. Incorporation of extra MA (trap passivation ligand) can supplement to bulky ammonium halides (growth passivation ligand) and make the perovskite NC surface more completely passivated. Appropriate amount of bulky ligands, around 20% molar ratio, can self-assemble at the grain surface and suppress the grain growth. By combination of bulky ammonium ligands with optimized structures and appropriate amount of excess MAI, perovskite films were fabricated with high luminescent efficiency and efficient PeLEDs with EQE over 15%.

Materials synthesis. MAI, BAI, PMAI, 4-F-PMAI and 4,5-F-PMAI were synthesized by mixing methylamine (33 wt % in ethanol), butylamine, 4-fluorophenylmethylamine and 4,5-fluorophenylmethylamine, respectively, (Sigma Aldrich) with equimolar amounts of aqueous HI (Sigma Aldrich, stabilized) at 0° C. (ice bath) with constant stirring for 2-4 h. The water/ethanol was removed from the organoammonium iodides by a rotary evaporator and then subsequently redissolved in isopropanol removed again by rotary evaporation to help remove excess water. The MAI, PMAI, 4-F-PMAI, and 4,5-F-PMAI were then recrystallized 2-3 times inside of an N$_2$ glovebox. Recrystallization was performed by slow cooling on a hot plate from a mixture of isopropanol/toluene (toluene to lower solubility and increase the liquid volume for better filtration) at a rate of approximately 2-5° C./h (overnight). The large white crystals were then gravity filtered inside of the N$_2$ glovebox, washed with an isopropanol/toluene mixture, then toluene, and dried. The BAI was extremely hygroscopic and did not crystallize. Instead, the BAI was purified by placing it in a gravity filtration setup inside of the N$_2$ glovebox and liberally washing it with diethyl ether until the powder turned very white in appearance.

Perovskite film deposition and characterization. Poly-TPD was dissolved in chlorobenzene at a concentration of 6 mg/ml. Poly-TPD was spin coated on ITO at 1,000 rpm for 60 s, followed by thermal annealing at 150° C. for 20 min. The poly-TPD layer was treated by O$_2$ plasma for 2 s to improve wetting. The MAPbI$_3$ precursors were dissolved in DMF (Sigma Aldrich, 99.8% anhydrous) at concentrations of 0.3 M. Then, different molar amounts of MAI, BAI, PMAI, 4-F-PMAI and 4,5-F-PMAI were added into MAPbI$_3$ solutions, respectively, before spin coating. The spin coating rate was 4,000 rpm, and toluene was dropped on the spinning substrate at 5 s.

The SEM measurements were conducted with an FEI XHR (extreme high resolution) SEM (Verios 460) using immersion mode. XRD measurements were performed with a Bruker D8 Discover X-ray diffractometer in the Bragg-Brentano parallel beam geometry, a diffracted beam monochromator, and a conventional Cu target X-ray tube set to 40 kV and 40 mA.

PLQY measurement and calculation. The PLQY of the perovskite films were measured using PTI QuantaMaster 400 Steady State Fluorometer with Petite Integrating Sphere. The excitation wavelength was 450 nm.

TRPL measurement. TRPL were taken using a Horiba DeltaFlex time-correlated single photon counting system. The samples were excited by a pulsed laser diode (Delta-Diode-Horiba) with a center wavelength of 406 nm, an excitation intensity of ~4 mW/cm$^2$ and a repetition rate that is less than the reciprocal of the measurement range. The time resolution was determined to be ~100 ps from the instrument response function. All decay traces were taken at 5 nm increment and with constant run time of 10 s. They were sufficiently fit with 3 exponentials: decay $(t) = \Sigma_{n=1}^{3} B_n e^{-t/T_n}$, $$T_{average} = \frac{\sum_{n=1}^{3} B_n T_n^2}{\sum_{n=1}^{3} B_n T_n}$$

where $B_n$ are normalized coefficients and $T_n$ are time constants.

Device fabrication and characterization. All perovskite films are dried at 70° C. for 20 min following spin coating to fully dry the film and ensure the full reaction of the precursors without affecting the morphology and grain size substantially. TPBi, LiF and Al layers were sequentially thermally evaporated on top of the perovskite film to thicknesses of 60 nm, 1.2 nm and 100 nm respectively. The device area was 0.1 cm$^2$. LEDs were measured in N$_2$ using a homemade motorized goniometer setup consisting of a Keithley 2400 sourcemeter unit, a calibrated Si photodiode (FDS-100-CAL, Thorlabs), a picoammeter (4140B, Agilent), and a calibrated fiber optic spectrophotometer (UVN-SR, Stellar-Net Inc.).

Figure 6:
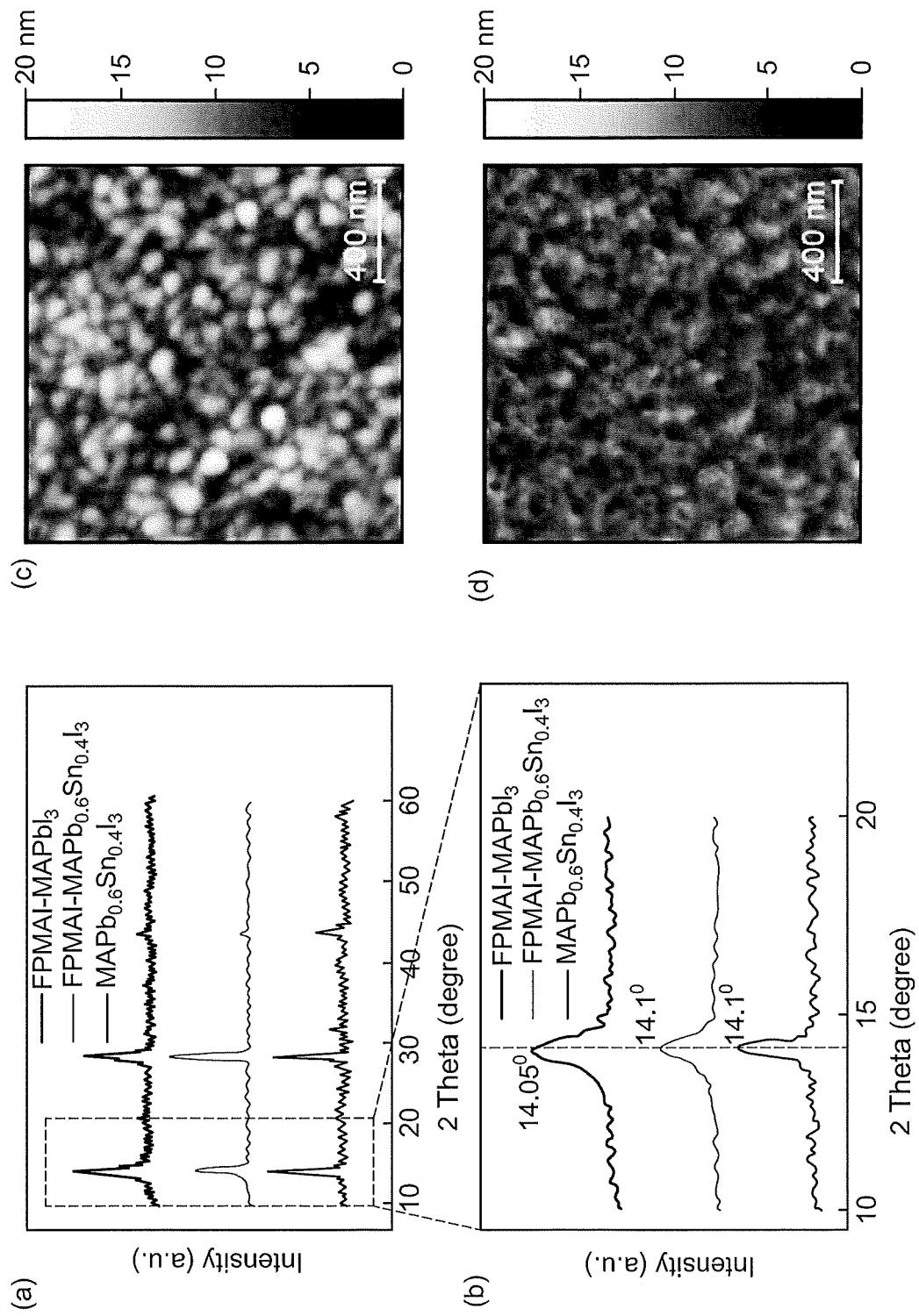
FIGS. 6a and 6b are XRD patterns of $MAPbI_3$ and $MAPb_{0.6}Sn_{0.4}I_3$ films with 4-fluorophenylmethylammonium iodide (FPMAI) growth passivation ligand according to some embodiments.
FIG. 6c is an atomic force microscopy (AFM) image of an $MAPb_{0.6}Sn_{0.4}I_3$ film without FPMAI.
FIG. 6d is an atomic force microscopy (AFM) image of an $MAPb_{0.6}Sn_{0.4}I_3$ film with FPMAI.

Example 2—Organic-Inorganic Perovskite Films and Light Emitting Diodes Comprising the Same In this example, mixed Pb—Sn perovskites are fabricated for efficient NIR LEDs with tunable emission between 850 and 950 nm. A highly efficient NIR LED is demonstrated with an EQE of 5.0%, a low turn-on voltage of 1.65 V, and an emission peak of 917 nm, utilizing a mixed perovskite with a Pb:Sn ratio of 0.6:0.4. We then examine the emission spectrum tunability of mixed Pb—Sn perovskites by changing the Pb:Sn ratio as well as through the incorporation of bromide ions, and observe no phase separation in our mixed Pb—Sn perovskite devices. Thus, mixed Pb—Sn perovskite represents a promising next generation NIR emitter that can deliver both high efficiency and good spectral tunability and stability. Nanocrystalline methylammonium (MA) lead tin iodide films were prepared according to a procedure wherein a bulky organoammonium halide ligand, 4-fluorobenzylammonium iodide (FPMAI), was added to the $MAPb_{1-x}Sn_xI_3$ precursor solution in dimethylformamide (DMF), and a toluene-assisted antisolvent process (or solvent exchange) was used for film formation. As discussed herein, the addition of such bulky ligands, with a molar ratio of 20%, simultaneously confines the growth of perovskite crystals to form nanometer-sized crystal grains and passivates perovskite crystal surfaces, which significantly improves the optical properties of the films. In the present case of mixed Pb—Sn perovskites, similar effects are observed. FIG. 6A provides the X-ray diffraction (XRD) patterns of different perovskite films, specifically $MAPbI_3$ with FPMAI, $MAPb_{0.6}Sn_{0.4}I_3$ with FPMAI, and $MAPb_{0.6}Sn_{0.4}I_3$ without FPMAI. Both the neat perovskite film and those processed with FPMAI possess the perovskite crystal structure, showing a diffraction peak near 14° that can be assigned to the (110) crystal plane. There is no observation of the formation of Ruddlesden-Popper phases for the films with FPMAI.

Compared to FPMAI-$MAPbI_3$, the XRD peaks of FPMAI-$MAPb_{0.6}Sn_{0.4}I_3$ exhibit a slight shift toward larger angle, demonstrating the incorporation of $Sn^{2+}$ that has a smaller ionic radius than $Pb^{2+}$ (FIG. 6b). Moreover, compared to $MAPb_{0.6}Sn_{0.4}I_3$ films without FPMAI, the XRD peaks of films with FPMAI have larger full width at half-maximum (FWHM), indicating the existence of smaller crystal grains. This can be further confirmed by atomic force microscopy (AFM) measurements. A film of $MAPb_{0.6}Sn_{0.4}I_3$ without FPMAI shows crystal grains approximately 100 nm in size with well-defined grain boundaries, as well as a root-mean-square (RMS) roughness of 2.7 nm (FIG. 6c). On the other hand, when FPMAI is added, the AFM image (FIG. 6d) shows that grains get much smaller, and are closepacked in the resulting film, making the grain boundaries hard to distinguish. The RMS value is also reduce to 1.7 nm, confirming the formation of an ultra-smooth nanocrystalline perovskite film.

Figure 7:
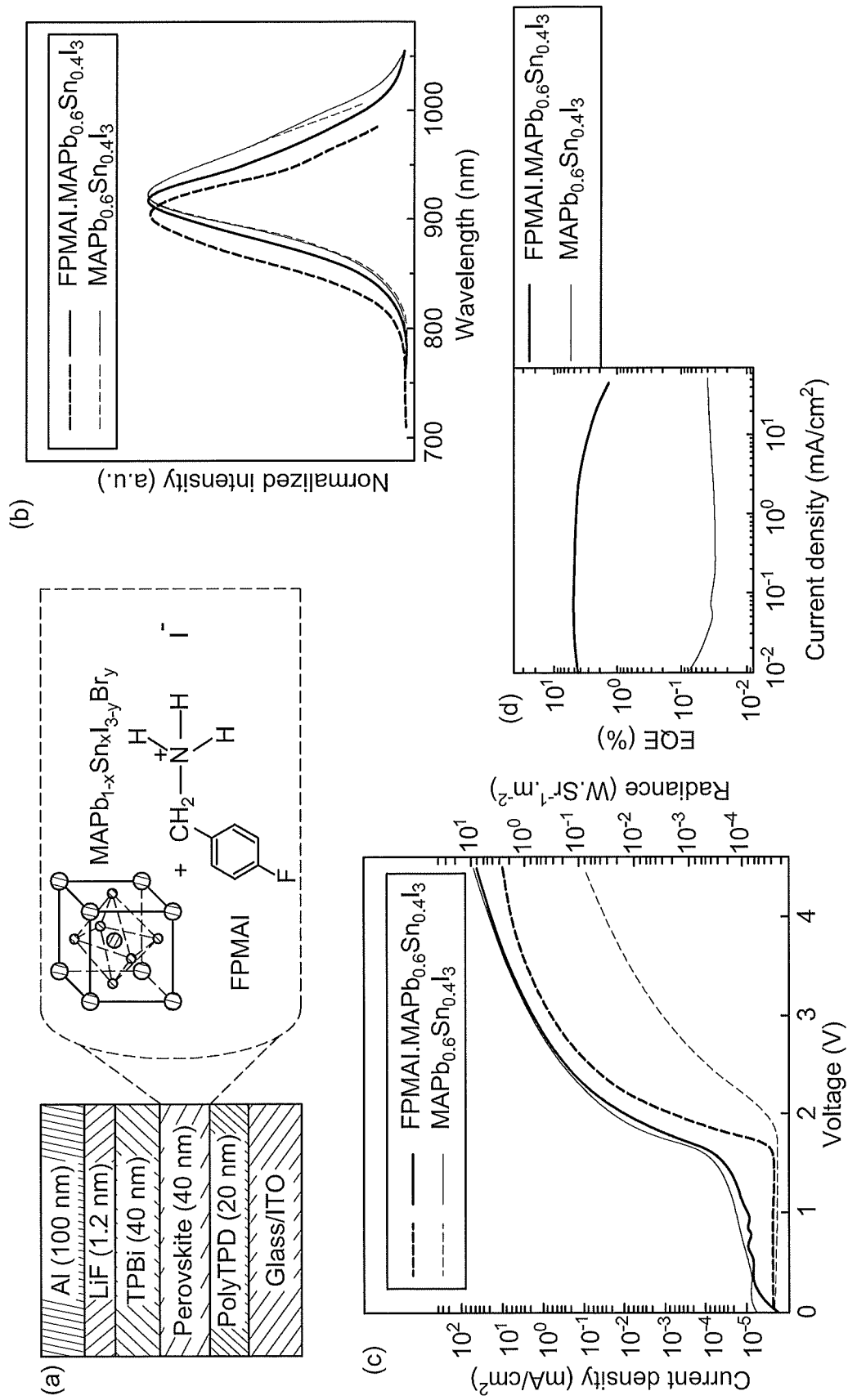
FIG. 7a illustrates PeLED architecture according to some embodiments.
FIG. 7b are photoluminescence spectra and electroluminescence spectra of $MAPb_{0.6}Sn_{0.4}I_3$ films with and without trap passivation ligand (MAI) according to some embodiments.
FIG. 7c are current density and radiance versus voltage curves of PeLEDs based on $MAPb_{0.6}Sn_{0.4}I_3$ films with and without growth passivation ligand, FPMAI.
FIG. 7d are external quantum efficiency (EQE) versus current density curves of PeLEDs based on $MAPb_{0.6}Sn_{0.4}I_3$ films with and without growth passivation ligand, FPMAI.
FIG. 7e are electroluminescence (EL) spectra under varying driving voltages for a PeLED comprising an $MAPb_{0.6}Sn_{0.4}I_3$ emitting layer.
FIG. 7f are EL spectra at differing time points under a constant current density of 1 mA/cm² for a PeLED comprising an $MAPb_{0.6}Sn_{0.4}I_3$ emitting layer.
FIG. 7g are normalized EQEs of devices with FPMAI-$MAPb_{0.6}Sn_{0.4}I_3$ emitting layers under various current densities.
FIG. 7h are EQE curves measured at day 0 and day 30 for a PeLED with FPMAI-$MAPb_{0.6}Sn_{0.4}I_3$ emitting layer.
Figure 7:
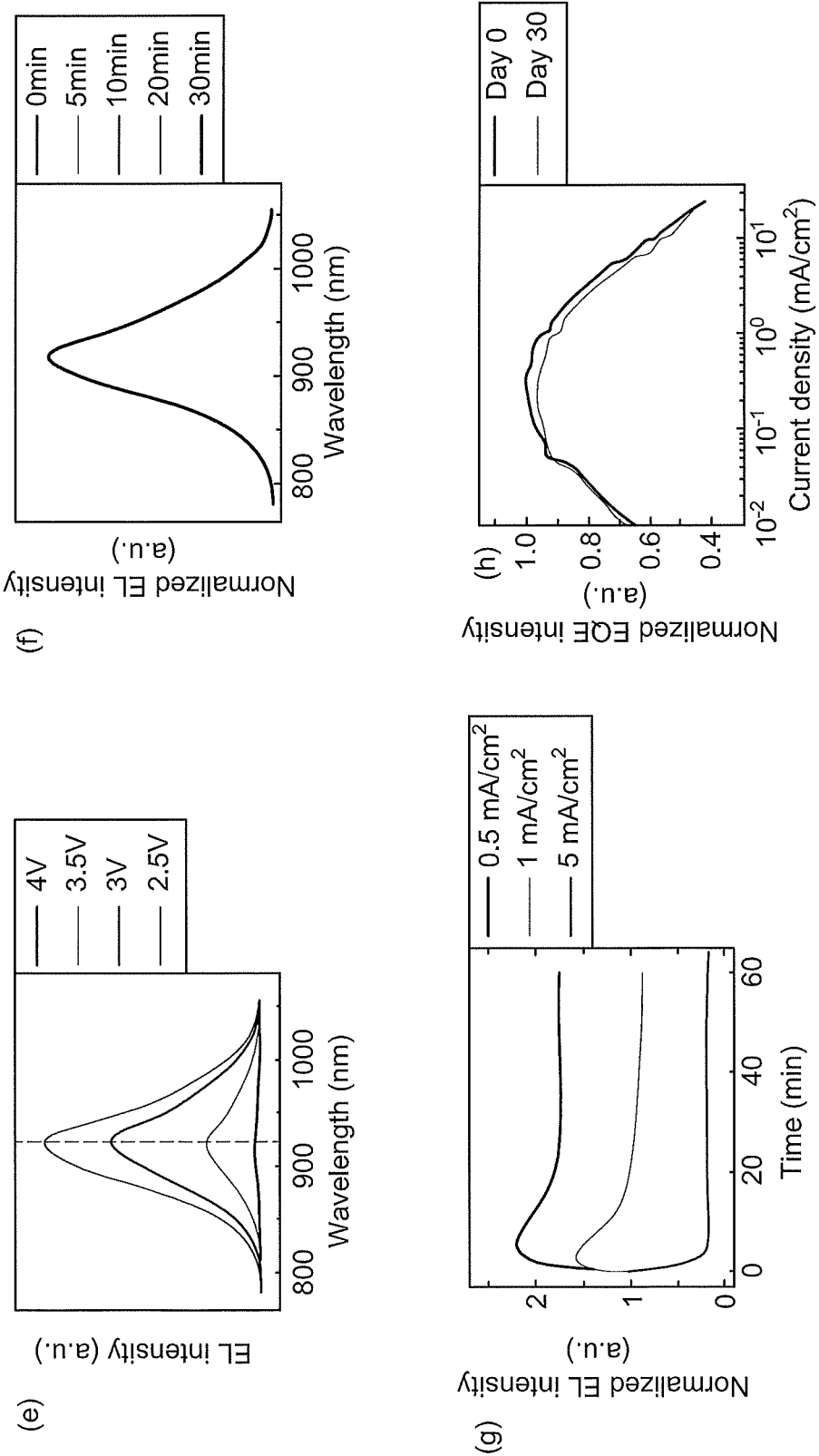

Light emitting diodes were made with a device structure of ITO/poly[N, N'-bis(4-butylphenyl)-N,N'-bis(phenyl)-benzidine-](poly-TPD)/perovskite/1,3,5-tris(1-phenyl-1Hbenzimidazol-2-yl)benzene (TPBi)/LiF/Al (FIG. 7a). For both photoluminescence (PL, dashed curves) and electroluminescence (EL, solid curves) spectra that are shown in FIG. 7b, the emission peaks of the samples with FPMAI are blue-shifted compared to those of the samples without FPMAI. This was attributed to the reduced grain size as well as the change of dielectric environment. The EL peak of the FPMAI device (917 nm) is red-shifted with respect to the PL peak of the corresponding film (906 nm). This was likely because the PL measurement excites the full depth of the film, while EL comes from a certain subset of the film volume and can be influenced by optical cavity effects within the device stack.

FIG. 7c presents the current density-radiance-voltage (J-R-V) curves for devices based on $MAPb_{0.6}Sn_{0.4}I_3$ with and without FPMAI additives. The J-V curves with and without additives look very similar, but the R-V curves differ from each other. The device with FPMAI additives has a turn-on voltage of approximately 1.65 V, and reaches a radiance of 2.7 W. $Sr^{-2} \cdot m^{-2}$ at 4.5 V, while the one without gives 0.09 W. $Sr^{-2} \cdot m^{-2}$ at the same voltage. The EQE value of the device with FPMAI additives reaches a maximum of 5.0% at 0.05 $mA/cm^2$, and remains above 4% for J up to 3 $mA/cm^2$ (FIG. 7d). This maximum EQE value is about 2 orders of magnitude higher than that obtained from the device without FPMAI, and is amongst the highest EQE values reported for thin film NIR LEDs operating beyond 900 nm. As described herein, the addition of 10% excess MAI was crucial to achieving high EQE. The EQE values at low current density are significantly increased when excess MAI (trap passivation ligand) is added, which was consistent with the defect passivation mechanisms discussed in Example 1.

To examine if there is phase separation in our mixed Pb—Sn perovskite films under operation, EL spectra of devices were measured using FPMAI-$MAPb_{0.6}Sn_{0.4}I_3$ emitting layers either under increasing voltage bias (FIG. 7e) or under constant current density for up to 30 min (FIG. 7f). No changes in EL spectra were observed in either condition, confirming that there was no B-site (i.e. Pb and Sn) segregation at the composition investigated.

Furthermore, the long-term stability of devices based on FPMAI-$MAPb_{0.6}Sn_{0.4}I_3$ emitting layers were also examined. FIG. 7g shows the evolution of normalized EL intensity over time, with the devices biased at various constant current densities of 0.5, 1 and 5 $mA/cm^2$. It was found that devices were rather stable at the relatively low current densities of 0.5 and 1 $mA/cm^2$, without significant degradation after 60 min of operation. In addition, under such conditions, the devices underwent an initial performance improvement, possibly due to a local rearrangement of excess ions under electrical bias. The device biased under 5 $mA/cm^2$, however, lost 80% of its initial performance within 5 min, and subsequently stabilized at approximately 18% of its initial EL intensity. Although the operational lifetime of mixed Pb—Sn perovskite LEDs requires considerable improvement, it is similar to that of many pure-lead based perovskite LEDs, indicating that the incorporation of Sn in these devices may not be the limiting factor for lifetime. In terms of shelf lifetime, there is only less than 5% of loss after storing the un-encapsulated device in $N_2$ for 30 days (FIG. 7h), suggesting that the mixed Pb—Sn LEDs can be stable in an inert atmosphere. All the above characteristics indicated that mixed Pb—Sn perovskites were promising candidates to make efficient and stable NIR LEDs.

Figure 8:
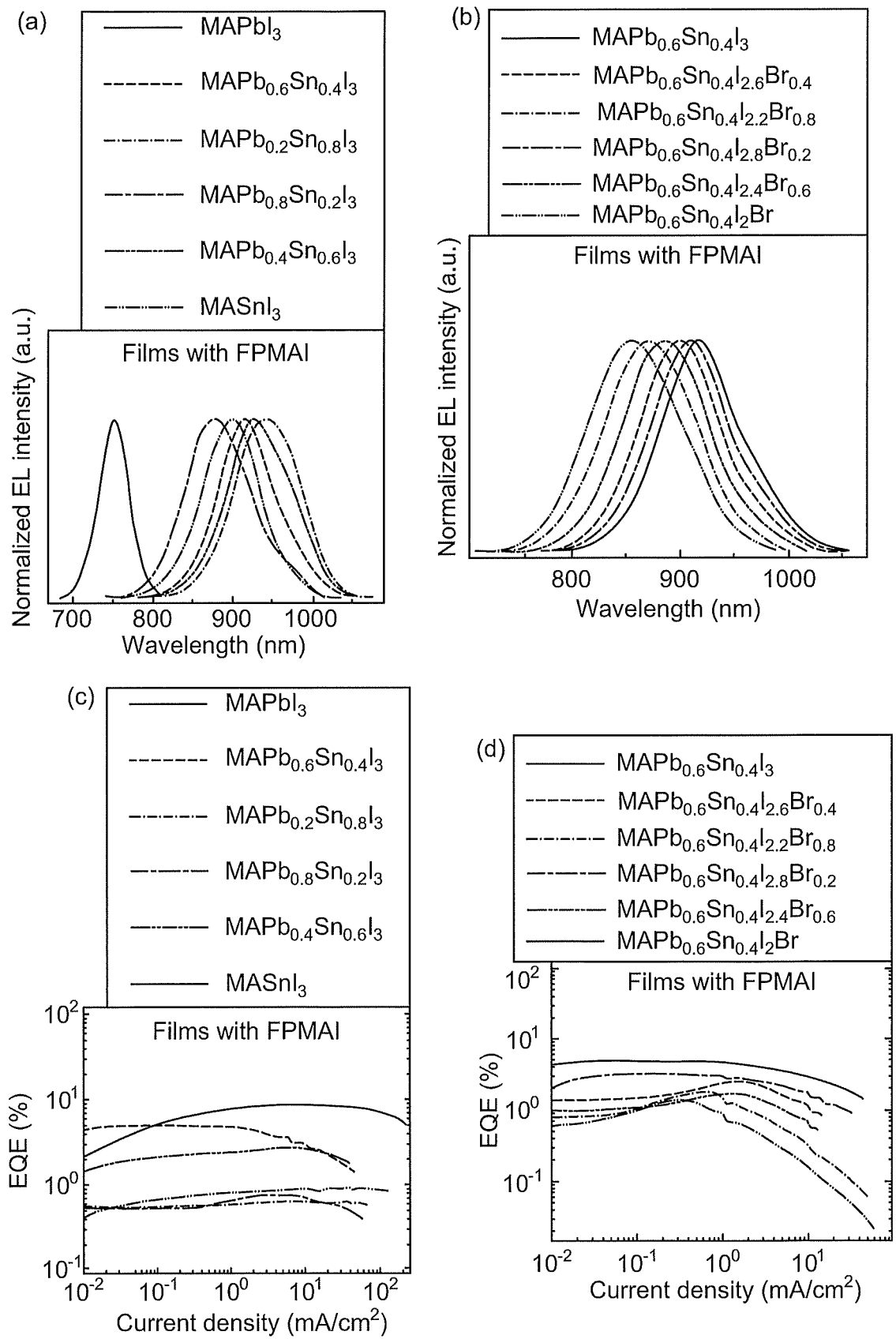
FIGS. 8a and 8b illustrate EL spectra of PeLEDs employing perovskites with differing Pb:Sn ratios.
FIGS. 8c and 8d illustrate EQE versus current density of PeLEDs employing perovskites with differing compositions.

The spectral tunability of light emitting materials is a supplemental asset. Mixed Pb—Sn perovskites are advantageous in that their emission spectrum can be tuned by changing either the Pb—Sn stoichiometry or by further introducing a halide mixture. FIG. 8a illustrates the EL spectra of LEDs using perovskites with different Pb:Sn ratios. With the increase of Sn content, the EL peak red-shifted from 750 nm (FPMAI-$MAPbI_3$) to 943 nm (FP-MAIMAP$b_{0.2}$ $Sn_{0.8}I_3$), but then blue-shifts beyond this Sn content to 900 nm for the pure Sn perovskite composition of FPMAI-$MASnI_3$. This was in agreement with the anomalous band gap bowing reported previously for mixed Pb—Sn perovskites. Furthermore, with a fixed Pb:Sn ratio of 0.6:0.4, the EL peak can be tuned from 917 nm (FPMAI-$MAPb_{0.6}Sn_{0.4}I_3$) to 854 nm (FPMAI-$MAPb_{0.6}Sn_{0.4}I_2Br$) via the incorporation of bromide (FIG. 8b). Therefore, but combining these two degrees of tunability, mixed Pb—Sn perovskites provide the possibility of spectral tuning over a wide range. In addition, while halide segregation is often reported in Pb-based mixed halide perovskites, this is not observed in any of the Pb—Sn perovskite films studied here.

The EQE vs. current density of LEDs based on perovskite emitting layers with different Pb—Sn compositions are presented in FIGS. 8c and 8d. Other than FPMAI-$MAPb_{0.6}Sn_{0.4}I_3$, maximum EQE values over 2% can be achieved for mixed Pb—Sn films such as FPMAIMAP$b_{0.4}Sn_{0.6}I_3$ (2.7%), FPMAI-$MAPb_{0.6}Sn_{0.4}I_{2.8}Br_{0.2}$ (3.3%), FPMAI- $MAPb_{0.6}Sn_{0.4}I_{2.8}Br_{0.2}$ (2.6%). It was noted that the turn-on voltage generally increased when the emission wavelength was blue-shifted, except for FPMAI-MASnI$_3$, which had the lowest turn-on voltage of approximately 1.37 V, while its emission peak was at shorter wavelength than most of films. It was speculated that this is related to the fact that pure-Sn perovskites often experience high levels of self-doping, which may reduce the current injection barriers and can also be responsible for the higher leakage current density in the pure-Sn device.

Experimental Section

Materials: PbI$_2$ powder is from TCI Chemicals, whereas SnI$_2$ (anhydrous, beads, 99.99%), LiF powder, and DMF (anhydrous, 99.8%) were obtained from Sigma-Aldrich. Toluene (anhydrous, 99.8%) was purchased from Alfa Aesar. PolyTPD and TPBi were purchased from American Dye Source and Lumtec, respectively. The organic cations, MAI and FPMAI, were synthesized in-house, and the details for synthesis can be found in elsewhere.[35] All of the commercial materials were used as received.

Perovskite film preparation: For mixed Pb—Sn perovskites with pure iodide, PbI$_2$ and SnI$_2$ with different molar ratios were dissolved together with MAI in DMF to obtain a 0.3 M $MAPb_{1-x}Sn_xI_3$ precursor solution. To introduce bromide, a portion of MAI was replaced with MABr in the precursor solution. Additionally, 20 mol % of FPMAI and 10 mol % of MAI were mixed with all the different precursor solutions. The perovskite films were deposited by spin coating at 6000 rpm. An anti-solvent step was performed by dropping toluene on the substrates at 3.5 s after commencing spinning. The samples were then annealed at 55° C. for 20 min.

Device fabrication: Poly-TPD was spin coated on the pre-cleaned ITO (Colorado Concept Coatings) at 1000 rpm for 60 s, followed by thermal annealing at 150° C. for 20 min. To improve to surface wettability, the poly-TPD layer was treated with O$_2$ plasma for 6 s at a power of 100 W. After that, the perovskite films were deposited in a N$_2$ filled glove box as described above. Then, TPBi, LiF, and Al layers were thermally evaporated on top of the perovskite films sequentially, with thicknesses of 60 nm, 1.2 nm, and 100 nm, respectively. The device area was 0.1 cm2 with a dimension of 2 mm×5 mm.

Characterizations: XRD measurements were performed with a Bruker D8 Discover X-ray diffractometer in the Bragg-Brentano parallel beam geometry, a diffracted beam monochromator, and a conventional Cu-target X-ray tube set to 40 kV and 40 mA. The PL spectra were obtained from a house-made PL system equipped with a SpectraPro HRS-300 spectrometer and a PIX-400B charge-coupled device from Princeton Instruments and a 355-nm excitation laser. The surface morphologies of the perovskite films were imaged with a Bruker Nanoman AFM in a tapping mode. Characteristics of the perovskite LEDs were measured in N$_2$ using a homemade motorized goniometer setup consisting of a Keithley 2400 sourcemeter unit, a calibrated Si photodiode (FDS-100-CAL, Thorlabs), a picoammeter (4140B, Agilent), and a calibrated fiber optic spectrophotometer (UVN-SR, StellarNet Inc.).

Various embodiments of the invention have been described in fulfillment of the various objectives of the invention. It should be recognized that these embodiments are merely illustrative of the principles of the present invention. Numerous modifications and adaptations thereof will be readily apparent to those skilled in the art without departing from the spirit and scope of the invention.

The invention claimed is:

1. A nanoparticle composition comprising:
a layer of organic-inorganic perovskite nanocrystals, the organic-inorganic perovskite nanocrystals comprising surfaces associated with growth passivation ligands and trap passivation ligands, wherein the growth passivation ligands are larger than the trap passivation ligands and are of size unable to incorporate into octahedral corner sites of the perovskite crystal structure, wherein the layer comprises excess halide, and the organic-inorganic perovskite nanocrystals are of the formula $Me_{1-y}A_yBX_{3-z}Y_z$, wherein Me is an alkali metal cation, A is an organic cation, B is an element selected from the group consisting of transition metals, Group IVA elements and rare earth elements and X and Y are independently selected from Group VIIA elements, wherein $0<y\leq1$ and wherein $0\leq z<3$, and the trap passivation ligands fill uncoordinated surface sites on at least one of B, X and Y.

2. The nanoparticle composition of claim 1, wherein the organic-inorganic perovskite nanocrystals have an average size less than 20 nm.

3. The nanoparticle composition of claim 1, wherein the organic-inorganic perovskite nanocrystals have an average size of 1-10 nm.

4. The nanoparticle composition of claim 1, wherein $0<z<3$.

5. The nanoparticle composition of claim 1, wherein the growth passivation ligands comprise organoammonium ions.

6. The nanoparticle composition of claim 5, wherein the organoammonium ions comprise one or more substituents selected from the group consisting of alkyl, heteroalkyl, alkenyl, cycloalkyl, cycloalkenyl, heterocycloalkyl, aryl and heteroaryl.

7. The nanoparticle composition of claim 1, wherein the trap passivation ligands comprise organoammonium ions.

8. The nanoparticle composition of claim 7, wherein the organoammonium ions comprise one or more substituents selected from the group consisting of alkyl and heteroalkyl.

9. The nanoparticle composition of claim 1, wherein the trap passivation ligands are selected from the group consisting of formamidinium, hydrazinium, guanidinium, azetidinium, azetamidinium, imidazolium, pyrrolidinium, cesium, rubidium, potassium, and mixtures thereof.

10. The nanoparticle composition of claim 1, wherein the layer of organic-inorganic perovskite nanocrystals is photoluminescent.

11. The nanoparticle composition of claim 10, wherein the layer of organic-inorganic perovskite nanocrystals has a quantum yield of at least 16%.

12. The nanoparticle composition of claim 10, wherein the layer of organic-inorganic perovskite nanocrystals has a quantum yield of at least 18%.

13. The nanoparticle composition of claim 10, wherein the layer of organic-inorganic perovskite nanocrystals exhibits a radiative recombination rate of at least $4.0\times10^6$ s$^{-1}$.

14. The nanoparticle composition of claim 1, wherein $0<y<1$.

15. An optoelectronic device comprising:
a photoactive layer including organic-inorganic perovskite nanocrystals, the organic-inorganic perovskite nanocrystals comprising surfaces associated with growth passivation ligands and trap passivation ligands, wherein the growth passivation ligands are larger than the trap passivation ligands and are of size unable to incorporate into octahedral corner sites of the perovskite crystal structure, wherein the photoactive layer comprises excess halide, and the organic-inorganic perovskite nanocrystals are of the formula $Me_{1-y}A_yBX_{3-z}Y_z$, wherein Me is an alkali metal cation, A is an organic cation, B is an element selected from the group consisting of transition metals, Group IVA elements and rare earth elements and X and Y are independently selected from Group VIIA elements, wherein $0<y\le1$ and wherein $0\le z<3$, and the trap passivation ligands fill uncoordinated surface sites on at least one of B, X and Y.

16. The optoelectronic device of claim 15, wherein the organic inorganic perovskite nanocrystals have an average size less than 20 nm.

17. The optoelectronic device of claim 15, wherein the trap passivation ligands comprise organoammonium ions.

18. The optoelectronic device of claim 17, wherein the organoammonium ions comprise one or more substituents selected from the group consisting of alkyl and heteroalkyl.

19. The optoelectronic device of claim 15, wherein the trap passivation ligands are selected from the group consisting of formamidinium, hydrazinium, guanidinium, azetidinium, azetamidinium, imidazolium, pyrrolidinium, cesium, rubidium, potassium, and mixtures thereof.

20. The optoelectronic device of claim 15, wherein the photoactive layer is a light emitting layer of a light emitting diode.

21. The optoelectronic device of claim 20, wherein the light emitting diode has an external quantum efficiency of at least 15 percent.

22. The optoelectronic device of claim 15, wherein the photoactive layer is a light absorption layer of a photovoltaic device.

23. The optoelectronic device of claim 21, wherein the light emitting layer has a peak emission from 700-1000 nm.

24. The optoelectronic device of claim 15, wherein $0<y<1$.

25. A nanoparticle composition comprising:
a layer of organic-inorganic perovskite nanocrystals, the organic-inorganic perovskite nanocrystals comprising surfaces associated with growth passivation ligands and trap passivation ligands, wherein the growth passivation ligands are larger than the trap passivation ligands and are of size unable to incorporate into octahedral corner sites of the perovskite crystal structure, wherein the organic-inorganic perovskite nanocrystals are of the formula $AB_{1-p}M_pX_{3-z}Y_z$, wherein A is an organic cation, B and M are elements independently selected from the group consisting of transition metals, Group IVA elements and rare earth elements and X and Y are independently selected from Group VIIA elements, wherein $0<p<1$ and wherein $0\le z<3$, and wherein the trap passivation ligands are present in stoichiometric excess relative to metal halide of the perovskite nanocrystals.

26. The nanoparticle composition of claim 25, wherein the organic-inorganic perovskite nanocrystals have an average size less than 20 nm.

27. The nanoparticle composition of claim 25, wherein the organic-inorganic perovskite nanocrystals have an average size of 1-10 nm.

28. The nanoparticle composition of claim 25, wherein $0<z<3$.

29. The nanoparticle composition of claim 25, wherein the growth passivation ligands comprise organoammonium ions.

30. The nanoparticle composition of claim 25, wherein B is lead and M is tin.

31. A nanoparticle composition comprising:
a layer of organic-inorganic perovskite nanocrystals, the organic-inorganic perovskite nanocrystals comprising surfaces associated with growth passivation ligands and trap passivation ligands, wherein the growth passivation ligands are larger than the trap passivation ligands and are of size unable to incorporate into octahedral corner sites of the perovskite crystal structure, wherein organic-inorganic perovskite nanocrystals are of the formula $Me_{1-y}A_yBX_{3-z}Y_z$, wherein Me is an alkali metal cation, A is an organic cation, B is an element selected from the group consisting of transition metals, Group IVA elements and rare earth elements and X and Y are independently selected from Group VIIA elements, wherein $0<y<1$ and wherein $0\le z<3$, and the trap passivation ligands fill uncoordinated surface sites on at least one of B, X and Y, and wherein the trap passivation ligands are present in stoichiometric excess relative to metal halide of the perovskite nanocrystals.

32. The nanoparticle composition of claim 31, wherein the growth passivation ligands comprise organoammonium ions.

* * * * *